(12) United States Patent
Lee

(10) Patent No.: US 7,716,401 B2
(45) Date of Patent: May 11, 2010

(54) MEMORY MODULE CAPABLE OF IMPROVING THE INTEGRITY OF SIGNALS TRANSMITTED THROUGH A DATA BUS AND A COMMAND/ADDRESS BUS, AND A MEMORY SYSTEM INCLUDING THE SAME

(75) Inventor: Jung-bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 139 days.

(21) Appl. No.: 11/024,860

(22) Filed: Dec. 30, 2004

(65) Prior Publication Data
US 2005/0210175 A1   Sep. 22, 2005

(30) Foreign Application Priority Data
Mar. 8, 2004   (KR) .................. 10-2004-0015592

(51) Int. Cl.
G06F 13/00 (2006.01)
H03K 17/16 (2006.01)
H03K 19/003 (2006.01)
G11C 7/06 (2006.01)
G11C 5/14 (2006.01)

(52) U.S. Cl. .............. 710/100; 326/30; 365/189.07; 365/189.09

(58) Field of Classification Search .......... 710/100; 326/30; 365/189.07, 189.09
See application file for complete search history.

(56) References Cited

U.S. PATENT DOCUMENTS

| | | | | |
|---|---|---|---|---|
| 5,815,446 A | * | 9/1998 | Tobita | 365/189.09 |
| 6,115,316 A | * | 9/2000 | Mori et al. | 365/230.03 |
| 6,125,419 A | * | 9/2000 | Umemura et al. | 710/110 |
| 6,337,814 B1 | * | 1/2002 | Tanida et al. | 365/189.09 |
| 6,356,106 B1 | * | 3/2002 | Greeff et al. | 326/30 |
| 6,424,590 B1 | * | 7/2002 | Taruishi et al. | 365/230.08 |
| 6,442,644 B1 | * | 8/2002 | Gustavson et al. | 711/105 |

(Continued)

FOREIGN PATENT DOCUMENTS

FR   2792760 A1 * 10/2000

(Continued)

OTHER PUBLICATIONS

Zheng, H., Lin, J., Zhang, Z., and Zhu, Z., "Decoupled DIMM: building high-bandwidth memory system using low-speed DRAM devices", Proceedings of the 36th Annual international Symposium on Computer Architecture (Austin, TX, USA, Jun. 20-24, 2009). ISCA '09. ACM, New York, NY, pp. 255-266.*

(Continued)

Primary Examiner—Glenn A Auve
Assistant Examiner—Faisal M Zaman
(74) Attorney, Agent, or Firm—Volentine & Whitt, PLLC

(57) ABSTRACT

A memory module and a related memory system are disclosed. The memory module comprises a semiconductor memory having a data output buffer, a data input buffer, a command/address input buffer and a first termination resistor unit connected to a data bus. The memory module further comprises a second termination resistor unit connected to an internal command/address bus. First and second termination resistor units are preferably of different resistive value and/or type.

14 Claims, 4 Drawing Sheets

U.S. PATENT DOCUMENTS

| | | | |
|---|---|---|---|
| 6,549,480 B2 * | 4/2003 | Hosogane et al. | 365/226 |
| 6,567,319 B2 * | 5/2003 | Sato et al. | 365/189.09 |
| 6,657,906 B2 * | 12/2003 | Martin | 365/198 |
| 6,667,928 B2 * | 12/2003 | Honma et al. | 365/226 |
| 6,707,724 B2 | 3/2004 | Kim et al. | |
| 6,738,844 B2 * | 5/2004 | Muljono et al. | 710/107 |
| 6,829,178 B2 * | 12/2004 | Koyama et al. | 365/189.07 |
| 6,882,570 B2 * | 4/2005 | Byeon et al. | 365/185.18 |
| 6,937,494 B2 * | 8/2005 | Funaba et al. | 365/63 |
| 6,963,218 B1 * | 11/2005 | Alexander et al. | 326/30 |
| 7,012,449 B2 * | 3/2006 | Lee et al. | 326/82 |
| 7,313,715 B2 | 12/2007 | Yoo et al. | |
| 2003/0058060 A1 * | 3/2003 | Yamamoto | 333/32 |
| 2003/0124989 A1 * | 7/2003 | Kwon | 455/88 |
| 2003/0197528 A1 * | 10/2003 | Shibata et al. | 326/86 |
| 2003/0206048 A1 * | 11/2003 | Toyoshima et al. | 327/524 |
| 2004/0170067 A1 * | 9/2004 | Kashiwazaki | 365/189.09 |
| 2005/0052912 A1 * | 3/2005 | Cogdill et al. | 365/202 |
| 2005/0253615 A1 * | 11/2005 | Sunwoo et al. | 324/761 |
| 2009/0003089 A1 * | 1/2009 | Do | 365/189.09 |
| 2009/0122634 A1 * | 5/2009 | Kang | 365/226 |

FOREIGN PATENT DOCUMENTS

| | | | | |
|---|---|---|---|---|
| JP | 2003133943 A | * | 5/2003 | |
| JP | 2004312262 A | * | 11/2004 | |
| JP | 2005065249 A | * | 3/2005 | |
| JP | 2007179725 A | * | 7/2007 | |
| JP | 2008017475 A | * | 1/2008 | |
| KR | 20020066019 A | | 8/2002 | |
| KR | 20020066381 A | | 8/2002 | |
| KR | 1020020066019 A | | 8/2002 | |
| KR | 1020020066381 A | | 8/2002 | |
| KR | 1020030066450 A | | 8/2003 | |

OTHER PUBLICATIONS

Knight et al., "A Self-Terminating Low-Voltage Swing CMOS Output Driver", Apr. 1988, IEEE, IEEE Journal of Solid-State Circuits, vol. 23, No. 2, pp. 457-464.*

Alghanim, A.; Lees, J.; Williams, T.; Benedikt, J.; Tasker, P.J., "Reduction of electrical baseband memory effect in high-power LDMOS devices using optimum termination for IMD3 and IMD5 using active load-pull," Microwave Symposium Digest, 2008 IEEE MTT-S International , vol., No., pp. 415-418, Jun. 15-20, 2008.*

Chang, N., Kim, K., and Cho, J., "Bus encoding for low-power high-performance memory systems", Proceedings of the 37th Annual Design Automation Conference (Los Angeles, California, United States, Jun. 5-9, 2000). DAC '00. ACM, New York, NY, pp. 800-805.*

* cited by examiner

MEMORY MODULE CAPABLE OF IMPROVING THE INTEGRITY OF SIGNALS TRANSMITTED THROUGH A DATA BUS AND A COMMAND/ADDRESS BUS, AND A MEMORY SYSTEM INCLUDING THE SAME

BACKGROUND OF THE INVENTION

1. Field of the Invention

The present invention relates generally to a memory system. More particularly, the present invention relates to a memory module providing improved signal integrity for signals transmitted via a data bus and a command/address bus. The present invention also relates to a memory system including the foregoing memory module.

A claim of priority is made to Korean Patent Application No. 2004-15592 filed on Mar. 8, 2004, in the Korean Intellectual Property Office, the disclosure of which is incorporated herein by reference in its entirety.

2. Description of the Related Art

Semiconductor memory, for example dynamic random access memory (DRAM), is widely used in computer systems such as a personal computers and servers. To improve the performance and capacity of a semiconductor memory, a plurality of semiconductor memories is typically mounted on a memory module and installed in a computer system. A conventional memory module is disclosed, for example, in published U.S. Patent Application ser. No. 2003/0149855.

FIG. 1 illustrates a conventional memory system. Referring to FIG. 1, a conventional memory system 100 includes a memory controller 110, a memory module 120, and termination resistors RT11 and RT12, collectively mounted on a motherboard.

Memory controller 110 transmits a command/address signal to semiconductor memories DRAM1 through DRAMn included in memory module 120 through a command/address bus CABUS. The command/address signal controls the data being written to (i.e., "input") or read from (i.e., "output") semiconductor memories DRAM1 through DRAMn via a data bus DQBUS.

Memory module 120 includes semiconductor memories DRAM1 through DRAMn and a command/address buffer 124. Semiconductor memories DRAM1 through DRAMn are connected to data bus DQBUS and command/address bus CABUS, which are system busses connecting memory controller 110. These connections are typically made using a stub, which preferably uses conventional stub series terminated transceiver logic (SSTL).

Command/address buffer 124 buffers the command/address signal transferred through command/address bus CABUS to provide a buffered command/address signal to semiconductor memories DRAM1 through DRAMn.

First semiconductor memory DRAM1 comprises a data output buffer 121, a data input buffer 122 and a command/address input buffer 123. Data output buffer 121 buffers internal output data DOUT and transmits buffered internal output data to data bus DQBUS. Data output buffer 121 is also called a data output driver. Data input buffer 122 and command/address input buffer 123 implement pseudo-differential operators. Data input buffer 122 amplifies a voltage difference between input data transmitted through data bus DQBUS and a reference voltage VREF to generate internal input data DIN which is written to memory cells (not shown) of first semiconductor memory DRAM1. The level of reference voltage VREF is preferably half of the power supply voltage level.

Command/address input buffer 123 amplifies a voltage difference between the command/address signal transferred through command/address buffer 124 and the reference voltage VREF to generate an internal command/address signal CAI used for controlling a write or read operation of first semiconductor memory DRAM1.

Semiconductor memories DRAM2 through DRAMn are identical to semiconductor memory DRAM1 and hence descriptions of the configuration and behavior of semiconductor memory DRAM1 given herein apply to semiconductor memories DRAM2 through DRAMn as well.

Termination resistors RT11 and RT12 are constructed in a parallel termination configuration and are supplied with a termination voltage VT1. Termination resistors RT11 and RT12 are respectively connected to the ends of data bus DQBUS and command/address bus CABUS in order to improve the integrity of signals transferred through data bus DQBUS and command/address bus CABUS. Termination resistors a RT11 and RT12 improve the integrity of signals transferred through data bus DQBUS and command/address bus CABUS by preventing signal reflections on the signal lines forming data bus DQBUS and command/address bus CABUS.

Command/address bus CABUS operates at a lower frequency than data bus DQBUS. Accordingly, termination resistor RT12, which prevents reflections of the command/address signal, is located on the motherboard and not on the memory module.

During a read operation performed by data output buffer 121 noise is typically present in reference voltage VREF. This reference voltage is commonly applied to data input buffer 122 and command/address input buffer 123. Thus, an increasing operation speed for semiconductor memory DRAM1 results in an increasing operating speed for data output buffer 121. Where noise is present in the reference voltage VREF, the increasing operating speed of output data buffer 121 produces an undesirable effect in the operation of data input buffer 122 and command/address buffer 123.

Accordingly, separate reference voltages are conventionally applied to data input buffer and command/address buffer 123. A conventional memory system supplying separate reference voltages to a data input buffer and a command/address buffer is shown in FIG. 2.

Referring to FIG. 2, a memory system 200 comprises a memory controller 210, a memory module 220, and termination resistors RT21 and RT22, collectively mounted on a motherboard.

Memory controller 210 transmits a command/address signal to semiconductor memories DRAM1 through DRAMn included in memory module 220 through command/address bus CABUS. The command/address signal controls data being written to or read from semiconductor memories DRAM1 through DRAMn through data bus DQBUS.

Memory module 220 includes semiconductor memories DRAM1 through DRAMn and a command/address buffer 224. Semiconductor memories DRAM1 through DRAMn are connected to data bus DQBUS and command/address bus CABUS, which are system busses connecting memory controller 210. These connections are typically made using a stub, which preferably uses conventional stub series terminated transceiver logic (SSTL).

Command/address buffer 224 buffers the command/address signal transferred through command/address bus CABUS to provide a buffered command/address signal to semiconductor memories DRAM1 through DRAMn.

First semiconductor memory DRAM1 comprises a data output buffer 221, a data input buffer 222 and a command/ address input buffer 223. Data output buffer 221 buffers internal output data DOUT and transmits the buffered internal output data to data bus DQBUS. Data output buffer 221 is also called a data output driver. Data input buffer 222 and command/address input buffer 223 implement pseudo-differential operators. Data input buffer 222 amplifies a voltage difference between input data transmitted through data bus DQBUS and a first reference voltage VREF_DQ to generate internal input data DIN which is written to memory cells (not shown) of first semiconductor memory DRAM1.

Command/address input buffer 223 amplifies a voltage difference between the command/address signal transferred through command/address buffer 224 and a second reference voltage VREF_CA to generate an internal command/address signal CAI used for controlling a write or read operation of first semiconductor memory DRAM1.

The levels of first and second reference voltages VREF_DQ and VREF_CA are preferably half a power supply voltage level when all the semiconductor memories DRAM1 through DRAMn are double data rate synchronous RAMs.

Semiconductor memories DRAM2 through DRAMn are identical to semiconductor memory DRAM1 and hence descriptions of the configuration and behavior of semiconductor memory DRAM1 given herein apply to semiconductor memories DRAM2 through DRAMn as well.

Termination resistors RT21 and RT22 are constructed in a parallel termination configuration and provided with a termination voltage VT2. Termination resistors RT21 and RT22 are respectively connected to the ends of data bus DQBUS and command/address bus CABUS in order to improve the integrity of signals transferred through data bus DQBUS and command/address bus CABUS.

As the operation speed of memory system 200 continually increases, the command/address signal transmitted through command/address bus CABUS increases as well. However, memory system 200 cannot appropriately increase the transmission speed of the command/address signal transmitted through command/address bus CABUS because termination resistor RT22, which is connected to the end of the command/address bus CABUS, is mounted on the motherboard.

SUMMARY OF THE INVENTION

The present invention provides a memory module capable of improving the integrity of signals transmitted via a data bus and a command/address bus, thereby allowing signal transmission speeds to increase. The present invention also provides a memory system including the foregoing memory module.

According to one aspect of the present invention a memory module comprises a semiconductor memory. The semiconductor memory comprises a data output buffer having an output, a data input buffer having a first input connected to the output of the data output buffer, a second input, and an output, a command/address input buffer having first and second inputs and an output, and a first termination resistor unit connected between the first input of the data input buffer and an external data bus.

The memory module further comprises a second termination resistor unit connected to an internal command/address bus. A first reference voltage is applied to the second input of the data input buffer and a second reference voltage is applied to the second input of the command/address input buffer. The first and second reference voltages are different from each other according to termination types of the first and second termination resistor units.

In a related aspect of the present invention, the memory module further comprises a command/address buffer that buffers a command/address signal transmitted through an external command/address bus and transmits the buffered command/address signal to the command/address input buffer of the semiconductor memory through the internal command/address bus.

The first termination resistor unit is preferably of a center tap termination type and the second termination resistor unit is preferably of a parallel termination type.

The level of the second reference voltage is preferably higher than the level of the first reference voltage.

The memory module preferably comprises more than one semiconductor memory. Where the memory module includes more than one semiconductor memory, the command/address input buffers of the respective semiconductor memories are preferably connected in a fly-by, daisy-chain structure by the internal command/address bus.

The first termination resistor unit preferably comprises a first termination resistor having a first end connected to a power supply and a second end connected to the first input of the data input buffer and a second termination resistor having a first end connected to the second end of the first termination resistor and a second end connected to ground.

The resistance values of the first and second termination resistors are preferably identical to each other.

The second termination resistor unit preferably comprises a termination resistor having a first end connected to the internal command/address bus and a second end connected to the power supply. The second termination resistor unit may alternatively comprise a termination resistor having a first end connected to the internal command/address bus and a second end connected to ground. The resistance value of the termination resister of the second termination resistor unit is preferably half the resistance value of the first termination resistor of the first termination resistor unit.

The data input buffer and command/address input buffer included in the semiconductor memory preferably implement pseudo-differential operators.

The memory module preferably comprises a stub connecting the external data bus and the command/address bus to the semiconductor memory. Conventional stub series terminated transceiver logic (SSTL) is contemplated by the present invention. In a related aspect, the memory module comprises a memory controller controlling the memory module, wherein, when the memory module includes more than one semiconductor memory, the lengths of data buses connecting the memory controller to the semiconductor memories are identical.

According to another aspect of the present invention, a memory system comprises a memory module comprising a semiconductor memory. The memory module and semiconductor memory comprised by the memory system are the same as the memory module and semiconductor memory previously described in this section.

The memory system further comprises a memory controller controlling data being written to or read from the semiconductor memory in the memory module.

The memory system preferably further comprises a parallel termination resistor connected to one end of the external data bus.

BRIEF DESCRIPTION OF THE DRAWINGS

The accompanying drawings illustrate several selected embodiments of the present invention. In the drawings.

DETAILED DESCRIPTION OF THE INVENTION

Figure 1:
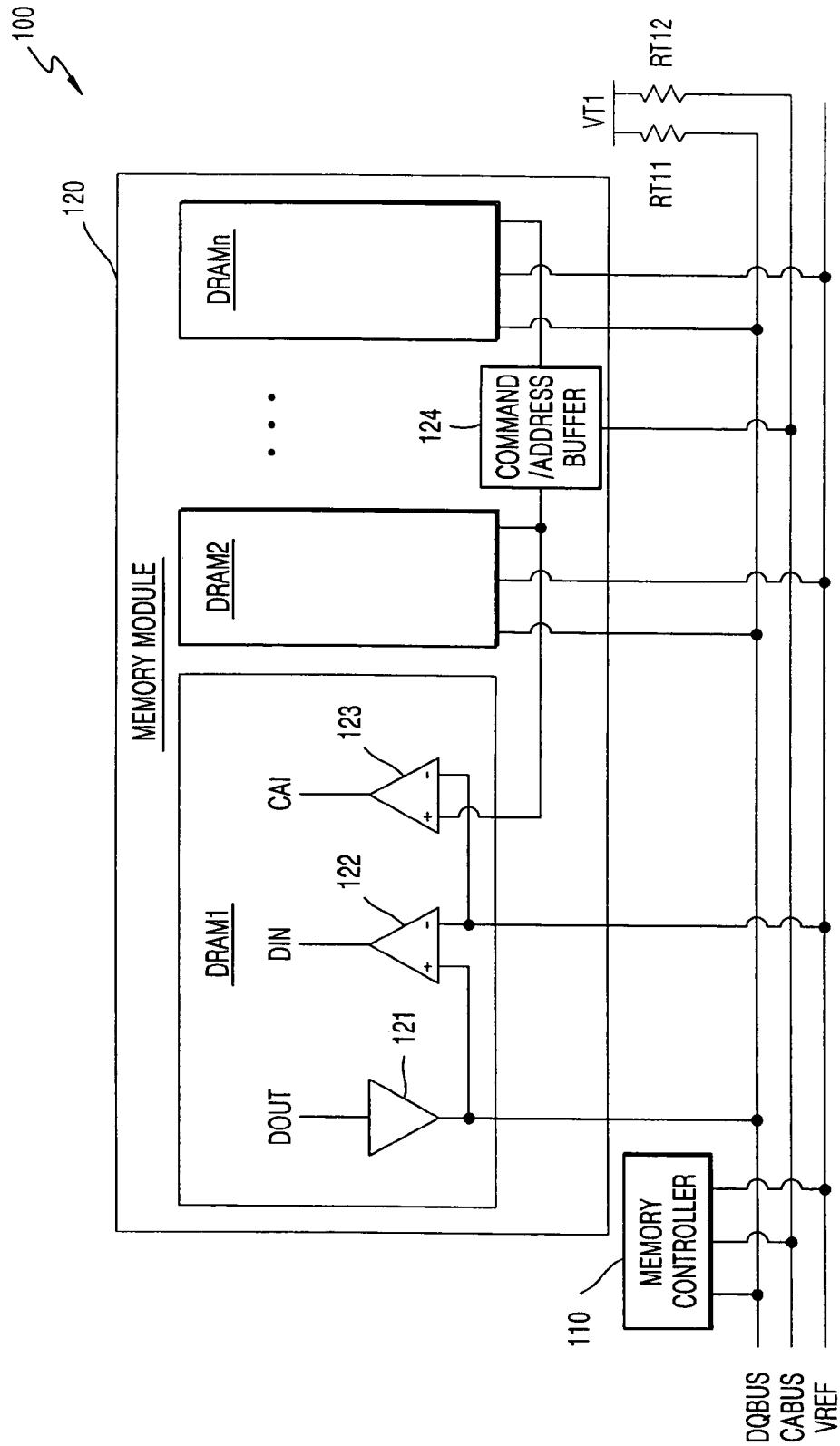
FIG. 1 is a circuit diagram illustrating a conventional memory system.

The present invention will now be described more fully with reference to the accompanying drawings, in which several exemplary embodiments of the present invention are shown. Throughout the drawings, like reference numerals are used to refer to like elements.

Figure 3:
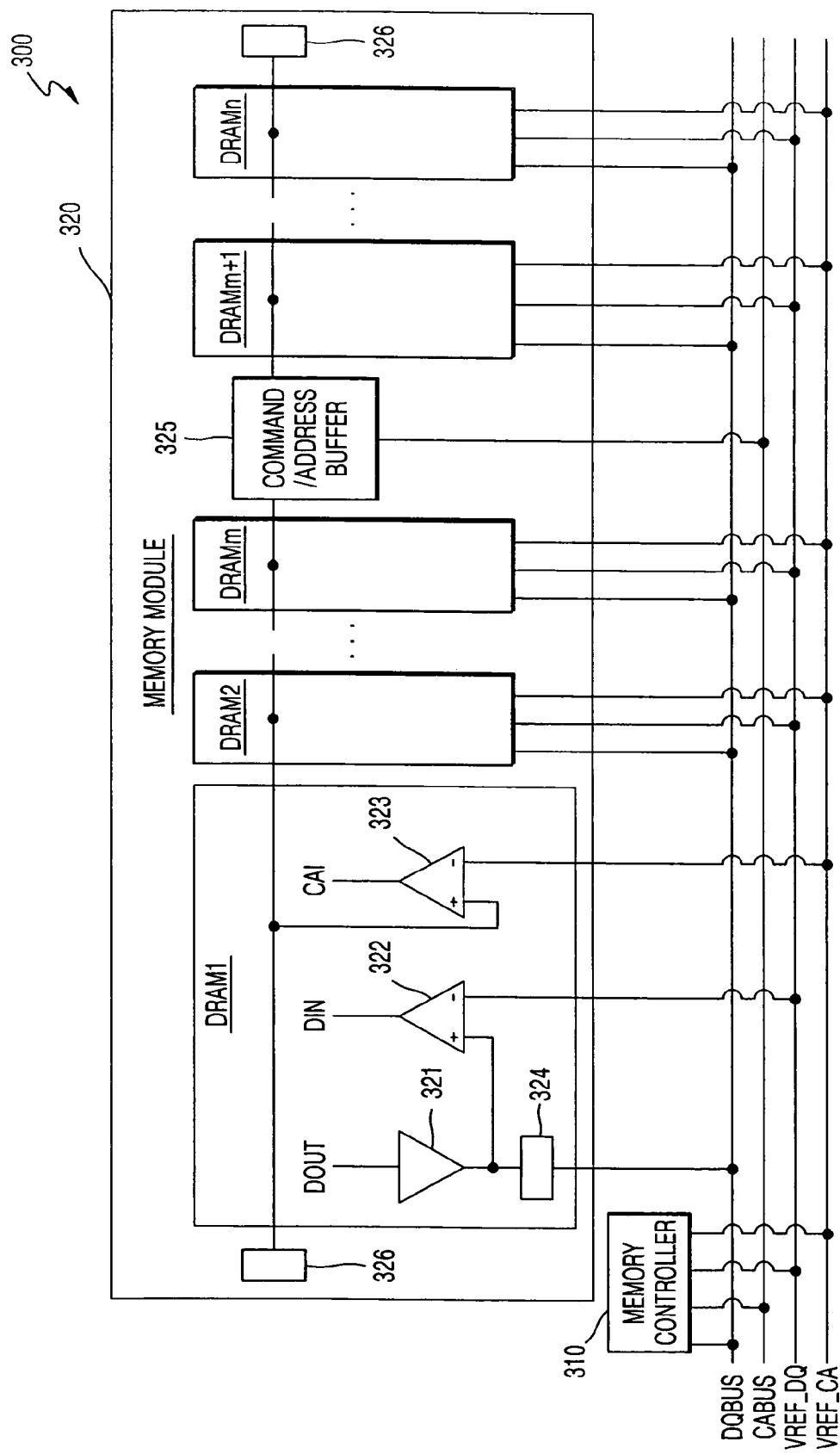
FIG. 3 is a circuit diagram illustrating one exemplary embodiment of a memory system including a memory module according to one aspect of the present invention.

FIG. 3 illustrates a memory system 300 comprising a memory module according to an embodiment of the present invention. Referring to FIG. 3, memory system 300 comprises a memory controller 310 and a memory module 320, collectively mounted on a motherboard.

Memory controller 310 transmits a command/address signal to semiconductor memories DRAM1 through DRAMn included in memory module 320 through a command/address bus CABUS. The command/address signal controls data being written to or read from semiconductor memories DRAM1 through DRAMn via a data bus DQBUS.

Memory module 320 includes semiconductor memories DRAM1 through DRAMn and a command/address buffer 325. Semiconductor memories DRAM1 through DRAMn are connected to data bus DQBUS and command/address bus CABUS, which are system busses connecting memory controller 310. These connections are typically made using a stub, which preferably uses conventional stub series terminated transceiver logic (SSTL). And, individual data buses connecting memory controller 310 to each one of semiconductor memories DRAM1 through DRAMn have lengths that are substantially the same.

Command/address buffer 325 buffers the command/address signal transferred through command/address bus CABUS to provide a buffered command/address signal to semiconductor memories DRAM1 through DRAMn. First and second ends of an internal command/address bus of memory module 320, which is connected to outputs of command/address buffer 325, are respectively connected to second termination resistor unit 326.

First semiconductor memory DRAM1 includes a data output buffer 321, a data input buffer 322, a command/address input buffer 323, and a first termination resistor unit 324. Data output buffer 321 buffers internal output data DOUT and transmits buffered internal output data to data bus DQBUS arranged outside memory module 320. Data output buffer 321 is also called a data output driver. Data input buffer 322 and command/address buffer 323 implement pseudo differential operators. Data input buffer 322 receives an output of data output buffer 321 and a first reference voltage VREF_DQ and outputs an amplified voltage difference between input data transmitted through data bus DQBUS and first reference voltage VREF_DQ. The output of data input buffer 322, denoted internal input data DIN, is written to memory cells (not shown) of first semiconductor memory DRAM1.

Command/address input buffer 323 amplifies a voltage difference between the command/address signal transferred through command/address buffer 325 and a second reference voltage VREF_CA to generate an internal command/address signal CA1 used for controlling a write or read operation of first semiconductor memory DRAM1.

The level of second reference voltage VREF_CA is preferably higher than the level of first reference voltage VREF_DQ. For example, when the level of first reference voltage VREF_DQ is half a power supply voltage level, the level of second reference voltage VREF_CA is preferably higher than half a power supply voltage level. This is because termination resistor units 324 and 326, which are respectively connected to data bus DQBUS and the command/address bus CABUS, have different termination types.

First termination resistor unit 324, which is for data bus DQBUS, is connected between data bus DQBUS, which is arranged outside memory module 320, and data input buffer 322. First termination resistor unit 324 is also called an on die termination resistor. First termination resistor unit 324 prevents the reflection of data signals transmitted through data bus DQBUS to improve the integrity of the data signal.

Semiconductor memories DRAM2 through DRAMn are identical to semiconductor memory DRAM1, and hence descriptions of the configuration and behavior of semiconductor memory DRAM1 apply to semiconductor memories DRAM2 through DRAMn as well.

The command/address input buffers respectively included in the semiconductor memories DRAM1 through DRAMn are connected in a fly-by, daisy-chain structure through the internal command/address bus of memory module 320, which is connected to the outputs of command/address buffer 325.

Termination resistor unit 326, associated with command/address bus CABUS, is connected to the inputs of respective command/address input buffers (e.g. command/address input buffer 323) of semiconductor memories DRAM1 through DRAMn through the internal command/address bus of memory module 320. Second termination resistor unit 326 prevents the reflection of the command/address signal transferred through command/address bus CABUS located outside memory module 320 to improve the integrity of the command/address signal. Due to its location inside memory module 320, the use of termination resistor unit 326 using second termination resistor unit 326 to improve the integrity of the command/address signal also allows the transmission speed of the command/address signal to increase.

While memory module 320 includes a plurality of semiconductor memories DRAM1 through DRAMn, other embodiments of the memory module designed in accordance with the present invention may include as few as one semiconductor memory. Furthermore, command/address buffer 325 may be excluded from memory module 320, i.e. command/address bus CABUS, which is arranged outside memory module 320, may be directly connected to the internal command/address bus of memory module 320.

Figure 2:
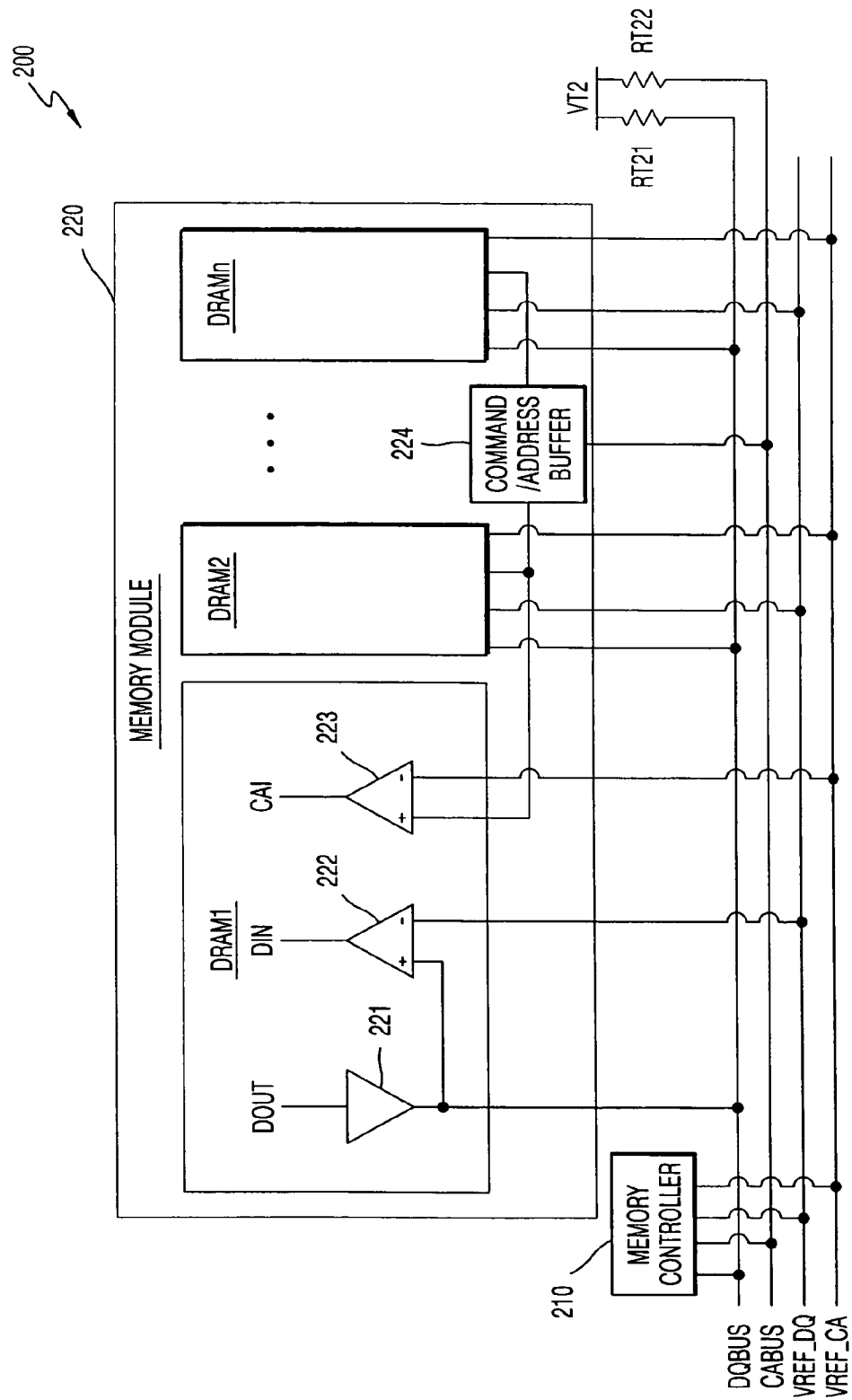
FIG. 2 is a circuit diagram illustrating another conventional memory system.

In yet another embodiment, memory system 300 additionally comprises a parallel termination resistor connected to one end of data bus DQBUS. For example, a parallel termination resistor is connected outside memory module 320, as shown in FIG. 2.

The memory system according to the present invention improves the integrity of the data signal and command/address signal, thereby allowing a corresponding increase in the operating speed of the semiconductor memories included in the memory module. The integrity of the data signal is improved by including a termination resistor unit for the data bus in each memory module of the semiconductor memory. The integrity of the command/address signal is improved by including a termination resistor unit for the command/address bus.

Figure 4:
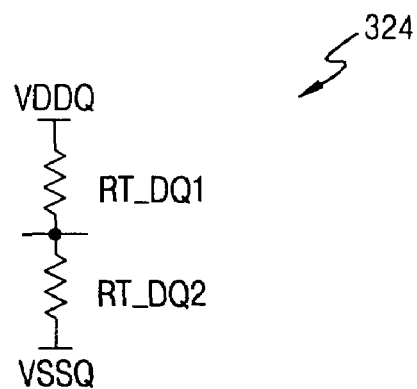
FIG. 4 illustrates first termination resistor unit 324 of FIG. 3 in more detail.

FIG. 4 illustrates first termination resistor unit 324 of FIG. 3 in more detail. Referring to FIG. 4, first termination resistor unit 324 is of a center tap termination type and includes a first termination resistor RT_DQ1 and a second termination resistor RT_DQ2, serially connected to first termination resistor RT_DQ1.

A power supply voltage VDDQ is supplied to one end of first termination resistor RT_DQ1 and a ground voltage VSSQ is applied to one end of second termination resistor RT_DQ2. The resistance values of first and second termination resistors RT_DQ1 and RT_DQ2 are preferably identical to each other. Because it is of the center tap termination type, first termination resistor unit 324 allows more increase in the operation speed of the data signal transmitted through the data bus than a parallel termination type resistor unit does.

Figure 5A:
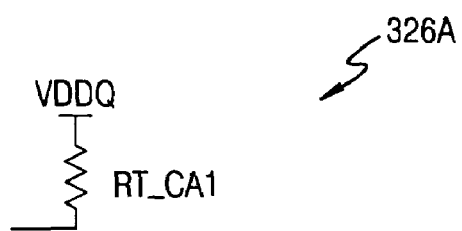
FIG. 5A illustrates one embodiment of second termination resistor unit 326 of FIG. 3 according to one aspect of the present invention.

FIG. 5A illustrates the second termination resistor unit of FIG. 3 according to one embodiment of the present invention. Referring to FIG. 5A, second termination resistor unit 326A comprises a termination resistor RT_CA1 of the parallel termination type. Because it is of the parallel termination type, second termination resistor unit 326A can reduce DC current consumption more than a center tap termination type termination resistor unit can.

Power supply voltage VDDQ is supplied to one end of parallel termination resistor RT_CA1. The resistance of parallel termination resistor RT_CA1 is preferably half the resistance of termination resistors RT_DQ1 or RT_DQ2 in first termination resistor unit 324 shown in FIG. 4.

When memory system 300 (shown in FIG. 3) is in a standby mode and power supply voltage VDDQ is applied to parallel termination resistor RT_CA1, the voltage level of command/address bus CABUS is maintained at the level of power supply voltage VDDQ. When memory system 300 is in a standby mode, a driver included in memory controller 310 (shown in FIG. 3) is turned off. Accordingly, second reference voltage VREF_CA, which preferably has a level at the center of the dynamic range of the command/address signal may be higher than the level of the first reference voltage VREF_DQ, which is preferably VDDQ/2.

Figure 5B:
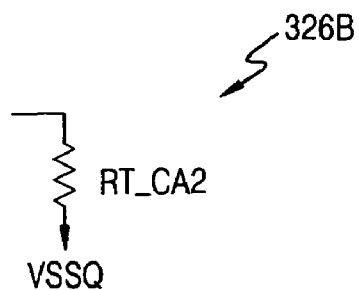
FIG. 5B illustrates another embodiment of second termination resistor unit 326 of FIG. 3 according to another aspect of the present invention.

FIG. 5B illustrates second termination resistor of FIG. 3 according to another embodiment of the present invention. Referring to FIG. 5B, second termination resistor unit 326B includes a parallel termination resistor RT_CA2, one end of which is tied to ground voltage VSSQ. Second termination resistor unit 326B is similar to second termination resistor unit 326A and so further explanation thereof is omitted.

The preferred embodiments disclosed in the drawings and the corresponding written description are teaching examples. Those of ordinary skill in the art will understand that various changes in form and details may be made to the exemplary embodiments without departing from the scope of the present invention which is defined by the following claims.

What is claimed is:

1. A memory module comprising:
  a plurality of semiconductor memory devices mounted on a memory module board of a memory module, each of the plurality of the semiconductor memory devices comprising:
    a data input buffer having a first input receiving data from a system data bus external to the memory module and a second input receiving a first reference voltage;
    a command/address input buffer having a first input receiving an internal command/address signal from an internal command/address bus and a second input receiving a second reference voltage different from the first reference voltage; and
    a first termination resistor unit of a first termination type comprising a first termination resistor having a first end connected to a power supply voltage and a second end connected to the first input of the data input buffer, the first termination resistor unit being configured as an on-die termination (ODT) of the semiconductor memory device;
  a second termination resistor unit of a second termination type connected at one end of the internal command/address bus and mounted on the memory module board, wherein the second termination type is different from the first termination type; and
  a command/address buffer mounted on the memory module board and configured to receive an external command/address signal from a system command/address bus external to the memory module, buffer the external command/address signal, and provide the buffered external command/address signal as the internal command/address signal via the internal command/address bus.

2. The memory module of claim 1, wherein the first termination type is a first parallel type termination and the second termination type is a second parallel type termination.

3. The memory module of claim 2, wherein the first termination resistor unit further comprises a second termination resistor having a first end connected to the first input of the data input buffer and a second end connected to ground.

4. The memory module of claim 3, wherein the second termination resistor unit comprises a third termination resistor having a first end connected to either a power supply voltage or ground, and a second end connected to the first input of the command/address input buffer of each of the plurality of the semiconductor memory devices.

5. A memory module comprising:
  a plurality of semiconductor memory devices mounted on a memory module board of a memory module, each of the plurality of the semiconductor memory devices comprising:
    a data input buffer having a first input receiving data from a system data bus external to the memory module and a second input receiving a first reference voltage;
    a command/address input buffer having a first input receiving a command/address signal from a command/address bus, and a second input receiving a second reference voltage different than the first reference voltage; and
  a first termination resistor unit configured as an on-die termination (ODT) of the semiconductor memory device, wherein the first termination resistor unit comprises;
    a first termination resistor having a first end connected to a power supply voltage and a second end connected to the first input of the data input buffer, and
    a second termination resistor having a first end connected to the first input of the data input buffer and a second end connected to ground; and
  a second termination resistor unit connected at one end of the internal command/address bus and mounted on the memory module board, wherein the second termination resistor unit comprises a third termination resistor having a first end connected to either a power supply voltage or ground, and a second end connected to the first input of the command/address input buffer.

6. A memory module comprising:
a plurality of semiconductor memory devices mounted on a memory module board of the memory module, each of the plurality of the semiconductor memory devices comprising:
  a data input buffer having a first input receiving data from a system data bus external to the memory modules and a second input receiving a first reference voltage;
  a command/address input buffer having a first input receiving a command/address signal from a system command/address bus external to the memory module and a second input receiving a second reference voltage different from the first reference voltage; and
  a first termination resistor unit of a first termination type configured as an on-die termination (ODT) of the semiconductor memory device and connected between the first input of the data input buffer and the system data bus; and
a second termination resistor unit of a second termination type different from the first termination type connected to the system command/address bus and provided external to the memory module board.

7. The memory module of claim 6, wherein the first termination type is a first parallel type termination and the second termination type is a second parallel type termination.

8. The memory module of claim 7, wherein the first termination resistor unit comprises a first termination resistor having a first end connected to a power supply voltage and a second end connected to the first input of the data input buffer.

9. The memory module of claim 8, wherein the first termination resistor unit further comprises a second termination resistor having a first end connected to the first input of the data input buffer and a second end connected to ground.

10. The memory module of claim 9, wherein the second termination resistor unit comprises a third termination resistor having a first end connected to either a power supply voltage or ground, and a second end connected to the first input of the command/address input buffer of each of the plurality of the semiconductor memory devices.

11. A memory module comprising:
a plurality of semiconductor memory devices mounted on a memory module board of the memory module, each of the plurality of the semiconductor memory devices comprising:
  a data input buffer having a first input receiving data from a system data bus external to the memory modules and a second input receiving a first reference voltage;
  a command/address input buffer having a first input receiving a command/address signal from an internal command/address bus disposed on the memory module board and directly connected to a system command/address bus external to the memory module, and a second input receiving a second reference voltage input different from the first reference voltage; and
  a first termination resistor unit of a first parallel termination type configured as an on-die termination (ODT) of the semiconductor memory device and connected between the first input of the data input buffer and the system data bus; and
a second termination resistor unit of a second parallel termination type different from the first parallel termination type connected to at least one end of the internal command/address bus and being mounted on the memory module board.

12. The memory module of claim 11, wherein the first termination resistor unit comprises a first termination resistor having a first end connected to a power supply voltage and a second end connected to the first input of the data input buffer.

13. The memory module of claim 12, wherein the first termination resistor unit further comprises a second termination resistor having a first end connected to the first input of the data input buffer and a second end connected to ground.

14. The memory module of claim 13, wherein the second termination resistor unit comprises a third termination resistor having a first end connected to either a power supply voltage or ground, and a second end connected to the first input of the command/address input buffer of each of the plurality of the semiconductor memory devices.

* * * * *